United States Patent
Hasegawa et al.

(10) Patent No.: US 9,224,905 B2
(45) Date of Patent: Dec. 29, 2015

(54) PHOTOELECTRIC CONVERSION DEVICE AND METHOD FOR PRODUCING PHOTOELECTRIC CONVERSION DEVICE

(71) Applicant: SANYO Electric Co., Ltd., Osaka (JP)

(72) Inventors: Isao Hasegawa, Akashi (JP); Hitoshi Sakata, Higashi-Osaka (JP)

(73) Assignee: PANASONIC INTELLECTUAL PROPERTY MANAGEMENT CO., LTD. (JP)

( * ) Notice: Subject to any disclaimer, the term of this patent is extended or adjusted under 35 U.S.C. 154(b) by 101 days.

(21) Appl. No.: 14/039,878

(22) Filed: Sep. 27, 2013

(65) Prior Publication Data

US 2014/0027875 A1 Jan. 30, 2014

Related U.S. Application Data

(63) Continuation of application No. PCT/JP2012/056110, filed on Mar. 9, 2012.

(30) Foreign Application Priority Data

Mar. 28, 2011 (JP) ................................. 2011-069671

(51) Int. Cl.
*H01L 31/18* (2006.01)
*H01L 31/0747* (2012.01)
(Continued)

(52) U.S. Cl.
CPC ...... *H01L 31/1868* (2013.01); *H01L 31/02168* (2013.01); *H01L 31/03529* (2013.01); *H01L 31/0682* (2013.01); *H01L 31/0747* (2013.01);
(Continued)

(58) Field of Classification Search
CPC ...................... H01L 31/1868; H01L 31/02168
USPC .............................................. 257/432; 438/72
See application file for complete search history.

(56) References Cited

U.S. PATENT DOCUMENTS

2001/0003679 A1* 6/2001 Cathey et al. .................. 438/740
2007/0256728 A1* 11/2007 Cousins ......................... 136/252
(Continued)

FOREIGN PATENT DOCUMENTS

JP    2006128258 A    5/2006
JP    2009152222 A    7/2009
(Continued)

OTHER PUBLICATIONS

Japanese Office Action corresponding to Application No. 2013-507338; Date of Mailing: Feb. 3, 2015.

*Primary Examiner* — Matthew W Such
*Assistant Examiner* — Warren H Kilpatrick
(74) *Attorney, Agent, or Firm* — Cantor Colburn LLP (57) ABSTRACT

In this method for producing a photoelectric conversion device: an i-type non-crystalline layer and an n-type non-crystalline layer comprising a non-crystalline semiconductor film are formed on the light-receiving surface of a semiconductor substrate; an i-type non-crystalline layer and an n-type non-crystalline layer comprising a non-crystalline semiconductor film are formed on the back surface of the semiconductor substrate; a protective layer is formed on the n-type non-crystalline layer; an insulating layer is formed on the n-type non-crystalline layer; and in the state where the top of the n-type non-crystalline layer is covered by the protective layer, patterning is performed by eliminating a portion of the i-type non-crystalline layer, the n-type non-crystalline layer, and the insulating layer.

10 Claims, 7 Drawing Sheets (51) Int. Cl.
*H01L 31/0352* (2006.01)
*H01L 31/068* (2012.01)
*H01L 31/0216* (2014.01)

(52) U.S. Cl.
CPC ........... *H01L 31/1804* (2013.01); *Y02E 10/547* (2013.01)

(56) References Cited

U.S. PATENT DOCUMENTS

| | | | |
|---|---|---|---|
| 2009/0007966 A1 | 1/2009 | Isaka et al. | |
| 2009/0163041 A1* | 6/2009 | Mungekar et al. | 438/792 |
| 2009/0223562 A1 | 9/2009 | Niira et al. | |
| 2010/0087031 A1 | 4/2010 | Veschetti et al. | |
| 2010/0263722 A1 | 10/2010 | Kubo et al. | |
| 2010/0275964 A1* | 11/2010 | Kinoshita | 136/244 |
| 2012/0012179 A1 | 1/2012 | Asaumi et al. | |
| 2013/0233378 A1* | 9/2013 | Moslehi et al. | 136/256 |

FOREIGN PATENT DOCUMENTS

| | | |
|---|---|---|
| JP | 2009200267 A | 9/2009 |
| JP | 2010504636 A | 2/2010 |
| JP | 2010258043 A | 11/2010 |
| WO | 2010113750 A1 | 10/2010 |

\* cited by examiner

PHOTOELECTRIC CONVERSION DEVICE AND METHOD FOR PRODUCING PHOTOELECTRIC CONVERSION DEVICE

CROSS REFERENCE TO RELATED APPLICATIONS

This application is a continuation under 35 U.S.C. §120 of PCT/JP2012/056110, filed Mar. 9, 2012, which is incorporated herein reference and which claimed priority to Japanese Application No. 2011-069671, filed Mar. 28, 2011. The present application likewise claims priority under 35 U.S.C. §119 to Japanese Application No. 2011-069671, filed Mar. 28, 2011, the entire content of which is also incorporated herein by reference.

TECHNICAL FIELD

The present invention relates to a back-contact photoelectric conversion device and a method for producing a photoelectric conversion device.

BACKGROUND ART

Various types of photoelectric conversion devices have been considered to enhance power generation efficiency in a solar power generation system or the like. Patent Literature 1 proposes a back-contact photoelectric conversion device in which a p-type semiconductor region and an n-type semiconductor region are formed on the opposite side (back surface side) to the light-receiving surface of a semiconductor substrate.

A back-contact photoelectric conversion device is not provided with electrodes on the light-receiving surface side but is provided with electrodes only on the back surface side, and therefore allows for an increase in an effective light-receiving area and an enhancement of power generation efficiency. In addition, connections among photoelectric conversion cells can be performed only on the back surface side, and it is therefore possible to use a wide wiring member. Accordingly, it is possible to suppress a voltage drop and power loss at a wiring part.

CITATION LIST

Patent Literature

Patent Literature 1: Japanese Patent Laid-Open Publication No. 2009-200267

SUMMARY OF INVENTION

Technical Problem

In a photoelectric conversion device, it is desired to have light from the light-receiving surface to a semiconductor region that generates carriers, with as little loss as possible, to thereby enhance photoelectric conversion efficiency. Furthermore, in order to reduce production costs, there is desired a method for producing a photoelectric conversion device, which involves as few steps as possible and does not lead to a decrease in conversion efficiency.

Solution to Problem

The present invention is a method for producing a photoelectric conversion device, including, a first step of forming a first passivation layer on at least a portion of a region in a first surface of a semiconductor substrate, the first passivation layer being composed of a non-crystalline semiconductor film; a second step of forming a second passivation layer on at least a portion of a region in a second surface of the semiconductor substrate, the second passivation layer being composed of a non-crystalline semiconductor film, the second surface being opposite to the first surface; a third step of forming a protective layer on at least a portion of a region in the first passivation layer; a fourth step of forming an insulating layer on at least a portion of a region in the second passivation layer; and a fifth step of performing patterning so as to eliminate a portion of the second passivation layer and a portion of the insulating layer, in such a state that at least the portion of a region in the first passivation layer is covered with the protective layer. The photoelectric conversion device is provided with an electrode only on the second surface side.

The present invention is a photoelectric conversion device, including, a semiconductor substrate; a first passivation layer formed on at least a portion of a region in a first surface of the semiconductor substrate, the first passivation layer being composed of a non-crystalline semiconductor film; a second passivation layer formed on at least a portion of a region in a second surface of the semiconductor substrate, the second passivation layer being composed of a non-crystalline semiconductor film, the second surface being opposite to the first surface; an antireflective layer formed on at least a portion of a region in the first passivation layer; and an insulating layer formed on at least a portion of a region in the second passivation layer, wherein an etching rate of the antireflective layer is higher than an etching rate of the insulating layer.

Advantageous Effects of Invention

The present invention can provide a method for producing a photoelectric conversion device that allows for an enhancement of photoelectric conversion efficiency in the photoelectric conversion device and a reduction in the number of steps.

DESCRIPTION OF EMBODIMENT

Figure 1:
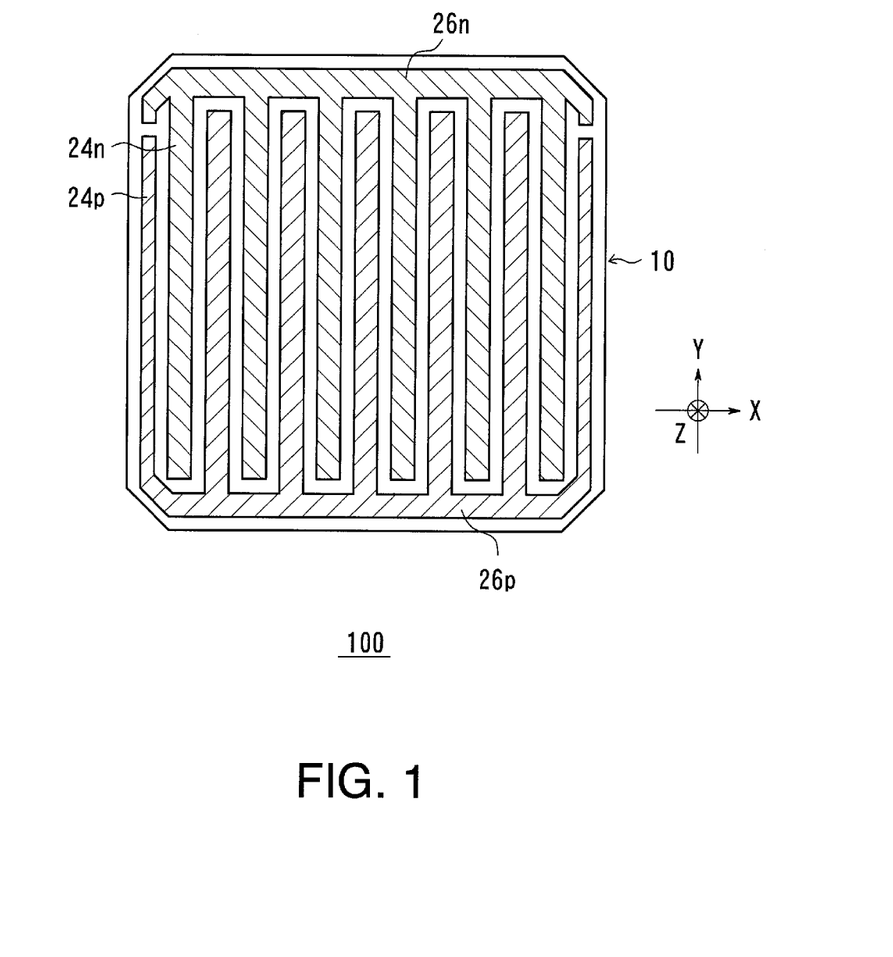
FIG. 1 is a plan view of a back surface side of a photoelectric conversion device according to an embodiment of the present invention.
Figure 2:
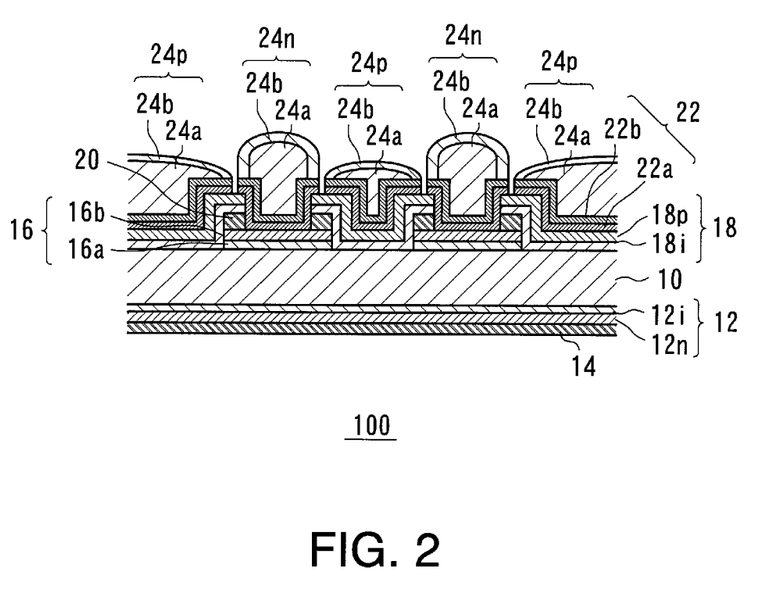
FIG. 2 is a sectional view of the photoelectric conversion device according to the embodiment of the present invention.

As shown in a plan view of a back surface side of FIG. 1 and a sectional view of FIG. 2, a photoelectric conversion device 100 according to an embodiment of the present invention is configured to include a semiconductor substrate 10, an i-type non-crystalline layer 12i, an n-type non-crystalline layer 12n, a transparent protective layer 14, an i-type non-crystalline layer 16i, an n-type non-crystalline layer 16n, an i-type non-crystalline layer 18i, a p-type non-crystalline layer 18p, an insulating layer 20, an electrode layer 22, and electrode sections 24 (24n, 24p) and 26 (26n, 26p).

Here, FIG. 2 shows a part of a cross section taken along the X direction in FIG. 1. Furthermore, in FIG. 1, in order to clearly show each of the regions of the electrode sections 24 (24n, 24p) and 26 (26n, 26p), hatchings with different angles are respectively applied to the regions.

Each figure in the embodiment is drawn schematically, and the size, the size proportion and the like are actually different from the reality. Furthermore, in some cases, the size proportion or the like of a figure is different from that of other figures. In the following description, in the photoelectric conversion device 100, the side to which light mainly enters is referred to as a light-receiving surface, and the opposite side to the light-receiving surface is referred to as a back surface.

Steps for producing the photoelectric conversion device 100 and the structure of the photoelectric conversion device 100 will be described below with reference to FIGS. 3 to 7.

Figure 3:
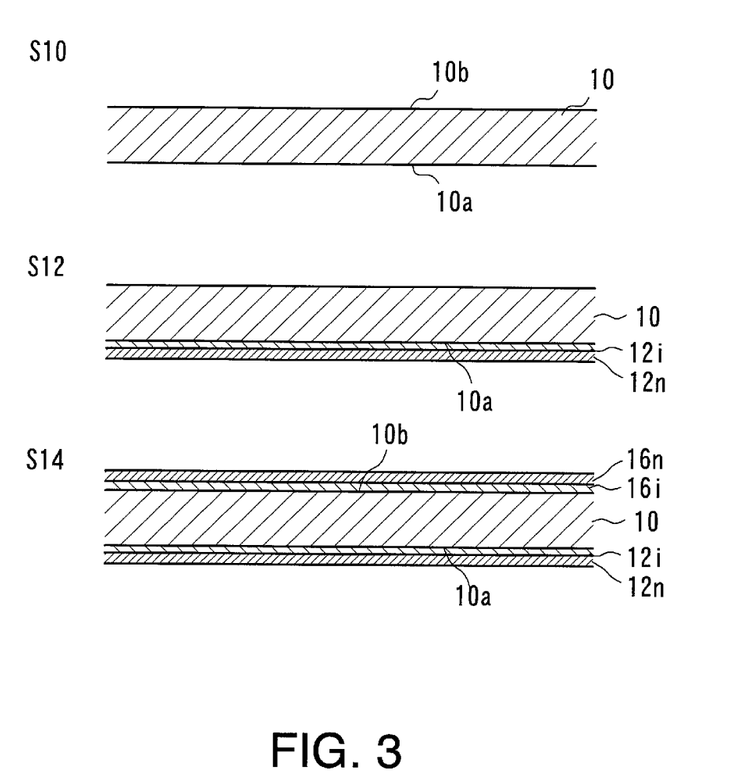
FIG. 3 is sectional views showing production steps of the photoelectric conversion device according to the embodiment of the present invention.

In step S10, a front surface and a back surface of the semiconductor substrate 10 are cleaned. The semiconductor substrate 10 may be a conductivity type crystalline semiconductor substrate that is an n-type or p-type. As the semiconductor substrate 10, for example, a monocrystalline silicon substrate, a polycrystalline silicon substrate, a gallium arsenide substrate (GaAs), an indium phosphide substrate (InP), or the like can be applied. The semiconductor substrate 10 absorbs entering light, and thereby generates carrier pairs of electrons and holes by photoelectric conversion. The semiconductor substrate 10 has a light-receiving surface 10a and a back surface 10b. In the following, there will be described an example in which an n-type monocrystalline silicon substrate is used as the semiconductor substrate 10.

Cleaning of the semiconductor substrate 10 can be performed using a hydrofluoric acid aqueous solution (HF aqueous solution) or an RCA cleaning liquid. It is preferable to form a textured structure on the light-receiving surface 10a of the semiconductor substrate 10 using an alkaline etchant such as a potassium hydroxide aqueous solution (KOH aqueous solution). In this case, it is possible to form a pyramidal textured structure having a (111) plane, by means of anisotropic etching of the semiconductor substrate 10 having a (100) plane with a KOH aqueous solution.

In step S12, the i-type non-crystalline layer 12i and the n-type non-crystalline layer 12n are formed on the light-receiving surface 10a of the semiconductor substrate 10. The i-type non-crystalline layer 12i and the n-type non-crystalline layer 12n constitute a passivation layer that covers at least a portion of the light-receiving surface 10a of the semiconductor substrate 10.

The i-type non-crystalline layer 12i is a layer composed of an intrinsic non-crystalline semiconductor film. Concretely, the i-type non-crystalline layer 12i is formed from amorphous silicon that contains hydrogen. The i-type non-crystalline layer 12i has a lower dopant concentration in the film than the n-type non-crystalline layer 12n. For example, preferably, the n-type or p-type dopant concentration of the i-type non-crystalline layer 12i should be $5 \times 10^{18}/cm^3$ or less.

The doping concentration in a semiconductor film can be measured by a secondary ion mass spectrometry method (SIMS) or the like. When the doping concentration in the film has a distribution, spatial (for example, the depth direction) average values may be compared.

Preferably, the i-type non-crystalline layer 12i should be thinned so as to make light absorption as low as possible, while it should be thickened so as to sufficiently passivate the back surface 10b of the semiconductor substrate 10. For example, it is preferable to be 0.2 nm or more to 50 nm or less.

The n-type non-crystalline layer 12n is a layer composed of a non-crystalline semiconductor film that contains a conductivity type n-type dopant. Concretely, the n-type non-crystalline layer 12n is formed from amorphous silicon containing hydrogen. The n-type non-crystalline layer 12n has a higher dopant concentration in the film than the i-type non-crystalline layer 12i. For example, preferably, the n-type dopant concentration of the n-type non-crystalline layer 12n should be $5 \times 10^{20}/cm^3$ or more. Preferably, the thickness of the n-type non-crystalline layer 12n should be thinned so as to make light absorption as low as possible, while it should be thickened so as to allow carriers generated near the light-receiving surface of the photoelectric conversion device 100 to move to the electrode layer 22. For example, it is preferable to be 2 nm or more to 50 nm or less.

The i-type non-crystalline layer 12i and n-type non-crystalline layer 12n can be formed by a plasma-enhanced chemical vapor deposition method (PECVD) or the like. The i-type non-crystalline layer 12i can be formed by means of causing silicon-containing gas such as silane ($SiH_4$) to be in a plasma state by application of RF high-frequency power to a parallel plate electrode or the like, and then supplying the gas to a film-forming surface of the semiconductor substrate 10 that is heated. The n-type non-crystalline layer 12n can be formed by means of adding phosphine ($PH_3$) or the like to silicon-containing gas such as silane ($SiH_4$), causing the gas to be in a plasma state by application of RF high-frequency power to a parallel plate electrode or the like, and then supplying the gas to a film-forming surface of the semiconductor substrate 10 that is heated. On this occasion, by diluting the silicon-containing gas with hydrogen ($H_2$), it is possible to vary the film properties of the i-type non-crystalline layer 12i and the n-type non-crystalline layer 12n depending on the dilution ratio.

In the embodiment, the non-crystalline layer includes a microcrystalline semiconductor film. The microcrystalline semiconductor film is a film in which crystal grains are precipitated in a non-crystalline semiconductor. The average grain diameter of the crystal grains is estimated to be approximately 1 nm or more to 80 nm or less, but is not limited to this.

In step S14, the i-type non-crystalline layer 16i and the n-type non-crystalline layer 16n are formed on the back surface 10b of the semiconductor substrate 10. The i-type non-crystalline layer 16i and the n-type non-crystalline layer 16n constitute a portion of a passivation layer that covers at least a portion of the back surface 10b of the semiconductor substrate 10.

The i-type non-crystalline layer 16i is a layer composed of an intrinsic non-crystalline semiconductor film. Concretely, the i-type non-crystalline layer 16i is formed from amorphous silicon containing hydrogen. The i-type non-crystalline layer 16i has a lower dopant concentration in the film than the n-type non-crystalline layer 16n. For example, preferably, the n-type or p-type dopant concentration of the i-type non-crystalline layer 16i should be $5 \times 10^{18}/cm^3$ or less.

Preferably, the thickness of the i-type non-crystalline layer 16i should be thinned so as to make light absorption as low as possible, while it should be thickened so as to sufficiently passivate the back surface 10b of the semiconductor substrate 10. For example, it is preferable to be 0.2 nm or more to 50 nm or less.

The n-type non-crystalline layer 16n is a layer composed of a non-crystalline semiconductor film that contains a conductivity type n-type dopant. Concretely, the n-type non-crystalline layer 16n is formed from amorphous silicon containing hydrogen. The n-type non-crystalline layer 16n has a higher dopant concentration in the film than the i-type non-crystalline layer 16i. For example, preferably, the n-type dopant concentration of the n-type non-crystalline layer 16n should be $5 \times 10^{20}/cm^3$ or more. Preferably, the thickness of the n-type non-crystalline layer 16n should be thinned so as to make light absorption as low as possible, while it should be thickened such that the open-circuit voltage of the photoelectric conversion device 100 is sufficiently high. For example, it is preferable to be 2 nm or more to 50 nm or less.

The i-type non-crystalline layer 16i and n-type non-crystalline layer 16n can be formed by a plasma-enhanced chemical vapor deposition method (PECVD) or the like. Concretely, similarly to the i-type non-crystalline layer 12i and n-type non-crystalline layer 12n, they can be formed by means of supplying silicon-containing gas such as silane ($SiH_4$) or a source gas composed of the silicon-containing gas and phosphine ($PH_3$) or the like added thereto, causing the gas to be in a plasma state by application of RF high-frequency power to a parallel plate electrode or the like, and then supplying the gas to a film-forming surface of the semiconductor substrate 10 that is heated. On this occasion, by diluting the silicon-containing gas with hydrogen ($H_2$), it is possible to vary the film properties of the i-type non-crystalline layer 16i and the n-type non-crystalline layer 16n depending on the dilution ratio.

In step S16, a protective layer 30 is formed on the n-type non-crystalline layer 12n. The protective layer 30 functions as a protective layer for the light-receiving surface of the photoelectric conversion device 100. Preferably, the material of the protective layer 30 should be silicon oxide, silicon nitride, silicon oxynitride or the like. Preferably, the thickness of the protective layer 30 should be, for example, 80 nm or more to 1 μm or less.

The protective layer 30 can be formed by a sputtering method using a target containing a raw material to be applied, a chemical vapor deposition method (CVD) using a gas containing a chemical element for a raw material to be applied, or the like.

In step S18, the insulating layer 20 is formed on the n-type non-crystalline layer 16n. The insulating layer 20 is provided in order to keep the i-type non-crystalline layer 16i and n-type non-crystalline layer 16n electrically insulated from the i-type non-crystalline layer 18i and p-type non-crystalline layer 18p. The insulating layer 20 may be transparent or opaque.

For example, the insulating layer 20 may be composed of an insulating material such as silicon oxide, silicon nitride and silicon oxynitride. Preferably, the thickness of the insulating layer 20 should be, for example, 80 nm or more to 1 μm or less. The insulating layer 20 can be formed by a sputtering method using a target containing a raw material to be applied, a plasma-enhanced chemical vapor deposition method (PECVD) using a gas containing a chemical element for a raw material to be applied, or the like.

The protective layer 30 is provided so as to be a layer whose etching rate is higher than the etching rate of the insulating layer 20, with respect to an etchant containing hydrogen fluoride (HF). Examples of the etchant containing hydrogen fluoride include a hydrogen fluoride (HF) aqueous solution, a mixed liquid of hydrogen fluoride (HF) and a hydrogen peroxide solution ($H_2O_2$), and buffered hydrofluoric acid, which is a mixed liquid of hydrogen fluoride (HF) and ammonium fluoride ($NH_4F$).

For example, when the insulating layer 20 and the protective layer 30 are composed of any one of silicon oxide, silicon nitride and silicon oxynitride, preferably, the hydrogen content ratio of the protective layer 30 should be higher than the hydrogen content ratio of the insulating layer 20. Also, preferably, the silicon content ratio of the protective layer 30 should be lower than the silicon content ratio of the insulating layer 20. In addition, preferably, the density of the protective layer 30 should be lower than the density of the insulating layer 20.

It is possible to regulate the etching rate with respect to an etchant containing hydrogen fluoride, hydrogen content ratio, silicon content ratio and density of the insulating layer 20 and the protective layer 30, by means of varying film-forming conditions of the insulating layer 20 and the protective layer 30.

Concretely, it is possible to provide the protective layer 30 and the insulating layer 20 that meet the above conditions, by means of forming the protective layer 30 by a plasma-enhanced chemical vapor deposition method (PECVD) and forming the insulating layer 20 by a sputtering method. That is, in formation of silicon oxide, silicon nitride or silicon oxynitride, typically, a film formed by a plasma-enhanced chemical vapor deposition method (PECVD) has a higher hydrogen content ratio and lower density than a film formed by a sputtering method. As a result, it is possible to provide the protective layer 30 whose etching rate is higher than the etching rate of the insulating layer 20, with respect to an etchant containing hydrogen fluoride.

When forming the protective layer 30 and the insulating layer 20 by a plasma-enhanced chemical vapor deposition method (PECVD), it is possible to provide the protective layer 30 and the insulating layer 20 that meet the above conditions, by means of forming the insulating layer 20 at a higher plasma density than the protective layer 30. In order to increase the plasma density, for example, it is allowable to increase the power to be applied to the electrode. That is, in formation of silicon oxide, silicon nitride or silicon oxynitride, typically, a lower plasma density in a plasma-enhanced chemical vapor deposition method (PECVD) results in formation of a film with a higher hydrogen content ratio and lower density. As a result, it is possible to provide the protective layer 30 whose etching rate is higher than the etching rate of the insulating layer 20, with respect to an etchant containing hydrogen fluoride.

In addition, when forming the protective layer 30 and the insulating layer 20, it is possible to provide the protective layer 30 and the insulating layer 20 that meet the above conditions, by means of performing film forming for the insulating layer 20 at a higher film-forming temperature setting than a film forming for the protective layer 30, if the other film-forming conditions are equal. That is, in formation of silicon oxide, silicon nitride or silicon oxynitride, typically, a higher film-forming temperature results in a formation of a film with a higher hydrogen content ratio and lower density. As a result, it is possible to provide the protective layer 30 whose etching rate is higher than the etching rate of the insulating layer 20, with respect to an etchant containing hydrogen fluoride.

Furthermore, when forming the protective layer 30 and the insulating layer 20, a higher hydrogen dilution ratio in a source gas allows for formation of silicon oxide, silicon nitride or silicon oxynitride with a higher hydrogen content ratio and lower density, if the other film-forming conditions are equal. As a result, it is possible to provide the protective layer 30 whose etching rate is higher than the etching rate of the insulating layer 20, with respect to an etchant containing hydrogen fluoride.

Figure 4:
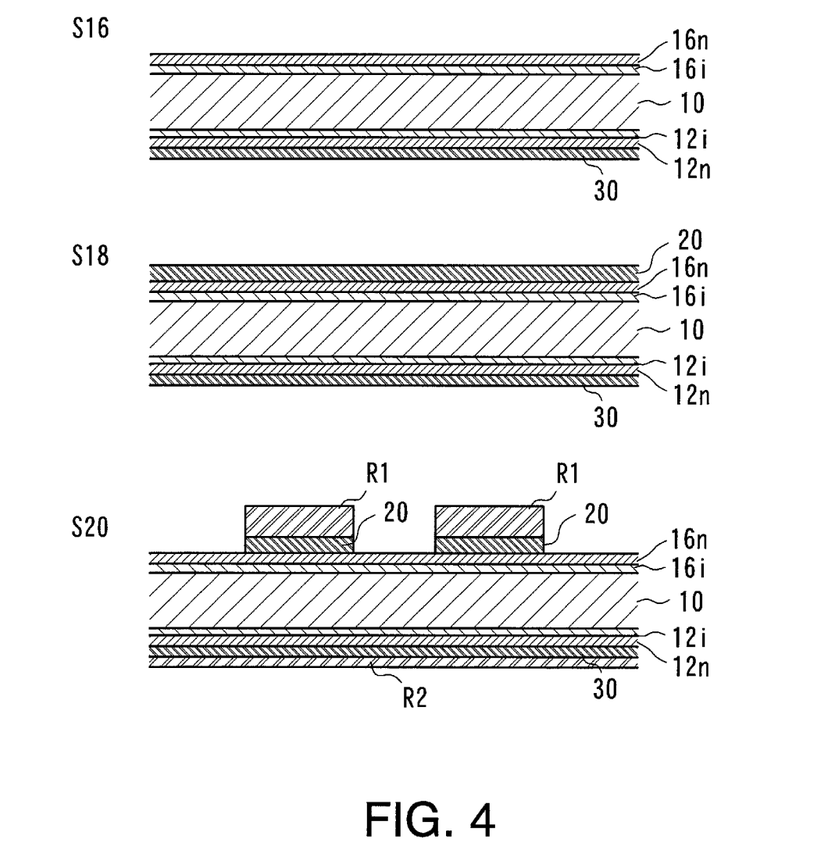
FIG. 4 is sectional views showing production steps of the photoelectric conversion device according to the embodiment of the present invention.

In step S20, etching of the insulating layer 20 is performed. Concretely, the etching is performed so as to eliminate a portion of a region on which the i-type non-crystalline layer 18i and p-type non-crystalline layer 18p are to be formed, in the insulating layer 20. For example, using a screen printing method or ink-jet method, a resist R1 is applied on a region where the insulating layer 20 is to be left so that a region where the insulating layer 20 is to be eliminated is exposed. Then, the insulating layer 20 on the region where the resist R1 is not applied is etched. At this time, the protective film 30 is protected by a protective film R2 so as not to be etched. As the protective layer R2, a protective sheet or a resist can be used. When the insulating layer 20 is composed of silicon oxide, silicon nitride or silicon oxynitride, for example, a hydrofluoric acid aqueous solution (HF aqueous solution) can be used as the etchant. Thereafter, the resist R1 and the protective film R2 are eliminated.

An etching paste in a paste form or etching ink with a regulated viscosity may be applied on the region where the insulating layer 20 is to be eliminated, for etching the insulating layer 20. The etching paste or etching ink can be applied in a predetermined pattern by a screen printing method or ink-jet method.

In step S22, the i-type non-crystalline layer 16i and the n-type non-crystalline layer 16n are etched. Concretely, the etching is performed so as to eliminate a portion of a region on which the i-type non-crystalline layer 18i and the p-type non-crystalline layer 18p are to be formed, in the i-type non-crystalline layer 16i and the n-type non-crystalline layer 16n.

The i-type non-crystalline layer 16i and n-type non-crystalline layer 16n exposed from the insulating layer 20, which is a mask, are etched using an alkaline etchant. As the etchant, for example, an aqueous solution containing sodium hydroxide (NaOH) can be used. As a result, in the back surface 10b of the semiconductor substrate 10, a region that is not covered with the insulating layer 20 is exposed.

Furthermore, the back surface 10b of the semiconductor substrate 10, that has been exposed from the insulating layer 20 by the elimination of the i-type non-crystalline layer 16i and the n-type non-crystalline layer 16n, is cleaned. The cleaning can be performed using a hydrofluoric acid aqueous solution (HF aqueous solution) and an RCA cleaning liquid in combination.

In steps S20 and S22, the protective layer 30, which covers the light-receiving surface 10a side of the semiconductor substrate 10, is also eliminated. As described above, since the protective layer 30 is provided so as to be a layer whose etching rate is higher than the etching rate of the insulating layer 20 with respect to an etchant containing hydrogen fluoride, the protective layer 30 is eliminated but the insulating layer 20 is not eliminated.

Figure 5:
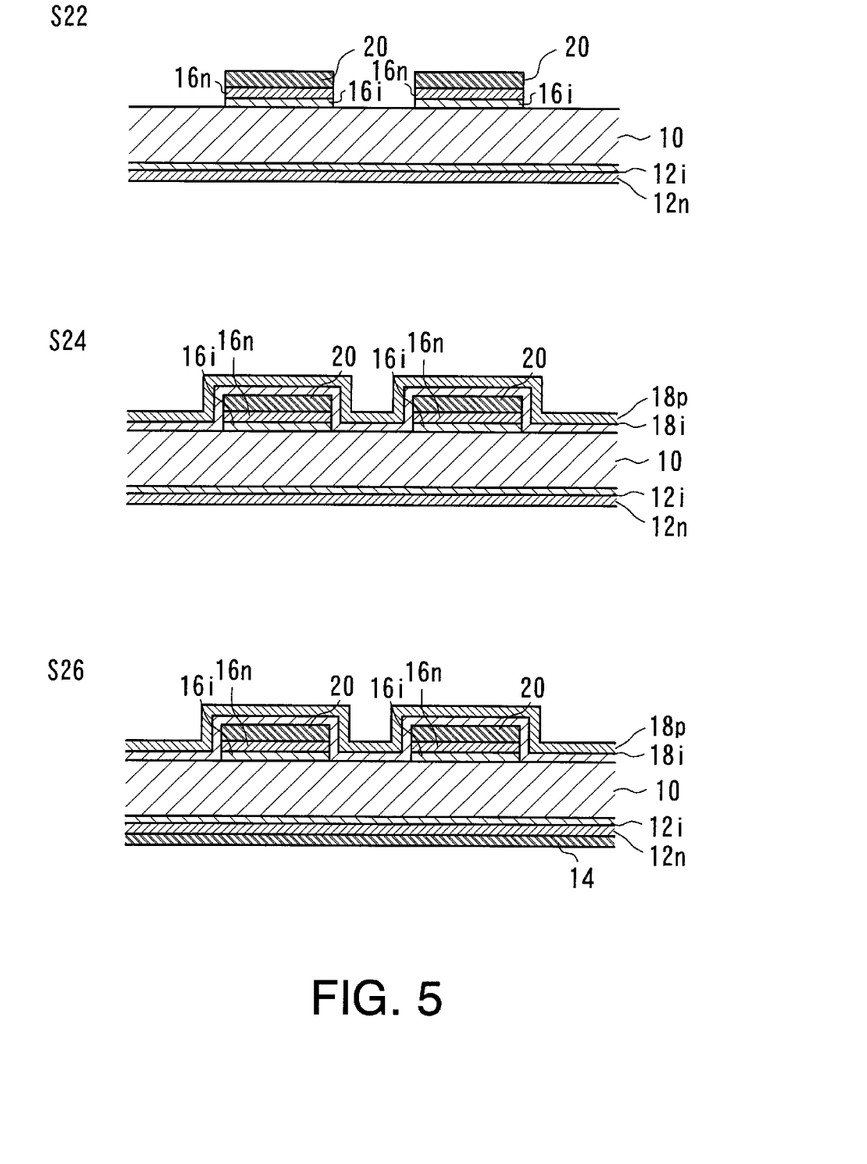
FIG. 5 is sectional views showing production steps of the photoelectric conversion device according to the embodiment of the present invention.

In step S24, the i-type non-crystalline layer 18i and the p-type non-crystalline layer 18p are formed on the back surface 10b side of the semiconductor substrate 10. The i-type non-crystalline layer 18i and the p-type non-crystalline layer 18p constitute at least a portion of a passivation layer that covers at least a portion of the back surface 10b of the semiconductor substrate 10.

The i-type non-crystalline layer 18i is a layer composed of an intrinsic non-crystalline semiconductor film. Concretely, the i-type non-crystalline layer 18i is formed from amorphous silicon containing hydrogen. The i-type non-crystalline layer 18i has a lower dopant concentration in the film than the p-type non-crystalline layer 18p. For example, preferably, the n-type or p-type dopant concentration of the i-type non-crystalline layer 18i should be $5 \times 10^{18}/cm^3$ or less.

Preferably, the thickness of the i-type non-crystalline layer 18i should be thinned so as to make light absorption as low as possible, while it should be thickened so as to sufficiently passivate the back surface 10b of the semiconductor substrate 10. For example, it is preferable to be 0.2 nm or more to 50 nm or less.

The p-type non-crystalline layer 18p is a layer composed of a non-crystalline semiconductor film that contains a conductivity type p-type dopant. Concretely, the p-type non-crystalline layer 18p is formed from amorphous silicon containing hydrogen. The p-type non-crystalline layer 18p has a higher dopant concentration in the film than the i-type non-crystalline layer 18i. For example, preferably, the p-type dopant concentration of the p-type non-crystalline layer 18p should be $5 \times 10^{20}/cm^3$ or more. Preferably, the thickness of the p-type non-crystalline layer 18p should be thinned so as to make light absorption as low as possible, while it should be thickened such that the open-circuit voltage of the photoelectric conversion device 100 is sufficiently high. For example, it is preferable to be 2 nm or more to 50 nm or less.

The i-type non-crystalline layer 18i and the p-type non-crystalline layer 18p can be formed by a plasma-enhanced chemical vapor deposition method (PECVD) or the like. Concretely, the i-type non-crystalline layer 18i can be formed by means of causing silicon-containing gas such as silane ($SiH_4$) to be in a plasma state by application of RF high-frequency power to a parallel plate electrode or the like, and then supplying the gas to a film-forming surface of the semiconductor substrate 10 that is heated. The p-type non-crystalline layer 18p can be formed by means of adding diborane ($B_2H_6$) or the like to silicon-containing gas such as silane ($SiH_4$), causing the gas to be in a plasma state by application of RF high-frequency power to a parallel plate electrode or the like, and then supplying the gas to a film-forming surface of the semiconductor substrate 10 that is heated. On this occasion, by diluting the silicon-containing gas with hydrogen ($H_2$), it is possible to vary the film properties of the i-type non-crystalline layer 18i and the p-type non-crystalline layer 18p depending on the dilution ratio.

In step S26, again, the transparent protective layer 14 is formed on the n-type non-crystalline layer 12n, from which the protective layer 30 has been eliminated. The transparent protective layer 14 has a function as an antireflective film and a function as a protective film for the light-receiving surface of the photoelectric conversion device 100. The transparent protective layer 14 may be conductive or insulative. As the transparent protective layer 14, it is possible to use, for example, a transparent insulating material such as silicon oxide, silicon nitride and silicon oxynitride, and a transparent conductive material such as tin oxide and indium oxide. Preferably, the thickness of the transparent protective layer 14 should be appropriately set depending on the refractive index of the material, or the like, so as to have an antireflective property as intended. Preferably, the transparent protective layer 14 should be, for example, 80 nm or more to 1 μm or less.

The transparent protective layer 14 can be formed by a sputtering method using a target containing a raw material to be applied, a chemical vapor deposition method (CVD) using a gas containing a chemical element for a raw material to be applied, or the like.

Preferably, the transparent protective layer 14 should be a film of the same material as the protective layer 30 formed in step S16. as a result, it is possible to use the same film-forming apparatus in step S16 and step S26, and reduce production costs of the photoelectric conversion device 100.

Figure 6:
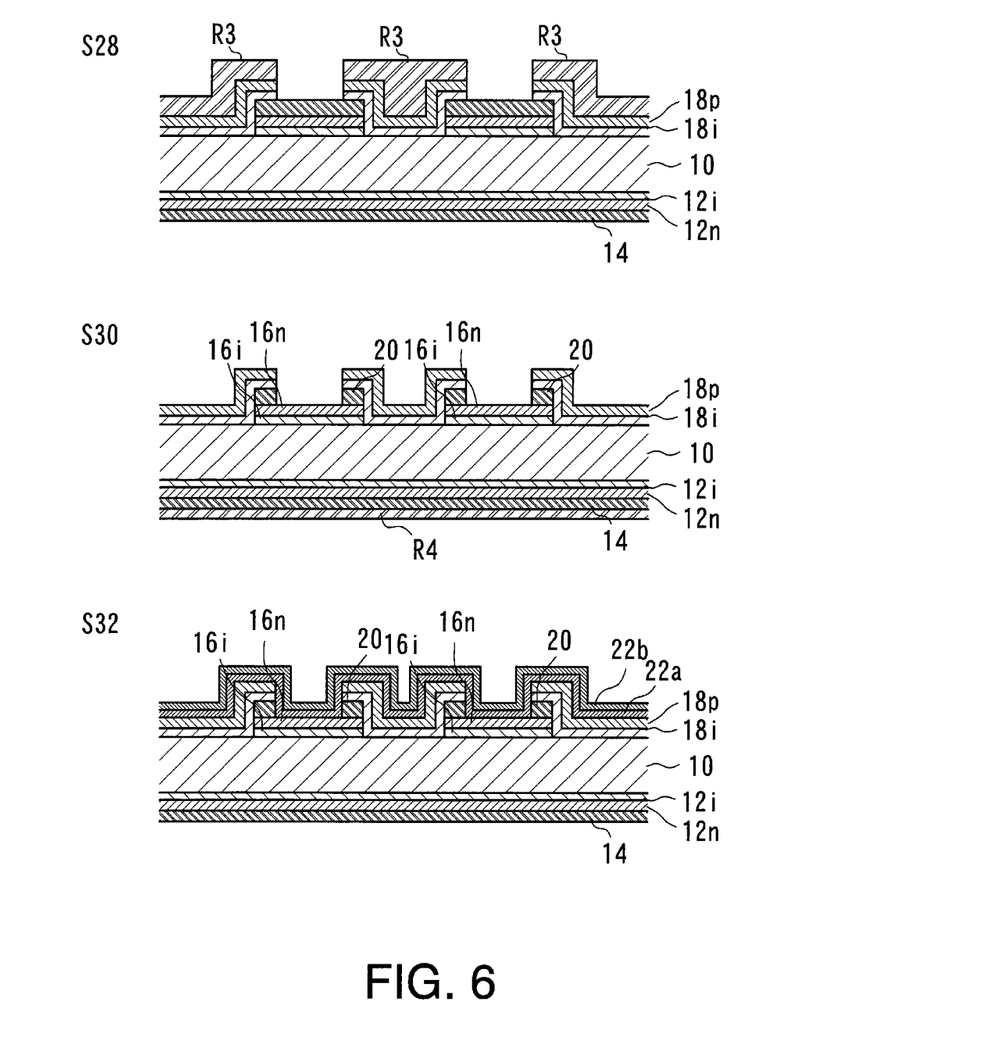
FIG. 6 is sectional views showing production steps of the photoelectric conversion device according to the embodiment of the present invention.

In step S28, in the i-type non-crystalline layer 18i and the p-type non-crystalline layer 18p, a portion covering the insulating layer 20 is eliminated.

Concretely, using a screen printing method or ink-jet method, a resist R3 is applied on a region where the i-type non-crystalline layer 18i and the p-type non-crystalline layer 18p are to be left, so that a region where the i-type non-crystalline layer 18i and p-type non-crystalline layer 18p are to be eliminated is exposed. Then, the i-type non-crystalline layer 18i and p-type non-crystalline layer 18p are etched using the resist R3 as a mask. In the etching, an alkaline etchant can be used. For example, an aqueous solution containing sodium hydroxide (NaOH) can be used. Thereafter, the resist R3 is eliminated.

An etching paste in a paste form or etching ink with a regulated viscosity may be applied on the region where the i-type non-crystalline layer 18i and the p-type non-crystalline layer 18p is to be eliminated, for etching the i-type non-crystalline layer 18i and the p-type non-crystalline layer 18p. The etching paste or etching ink can be applied in a predetermined pattern by a screen printing method or ink-jet method.

In step S30, the insulating layer 20 is etched. Concretely, using the i-type non-crystalline layer 18i and p-type non-crystalline layer 18p partially eliminated in step S28 as a mask, the exposed portion in the insulating layer 20 is eliminated by etching with an etching agent. At this time, the transparent protective film 14 is protected by a protective film R4 so as not to be etched. As the protective film R4, a protective sheet or a resist can be used. Here, an etching agent for which the etching rate of the insulating layer 20 is higher than the etching rate of the p-type non-crystalline layer 18p is used. For example, a hydrofluoric acid aqueous solution (HF) or the like can be used as the etching agent. As a result, only the insulating layer 20, that is exposed from the i-type non-crystalline layer 18i and the p-type non-crystalline layer 18p, is selectively etched so that the n-type non-crystalline layer 16n is exposed at that region. Thereafter, the protective film R4 is eliminated.

Figure 7:
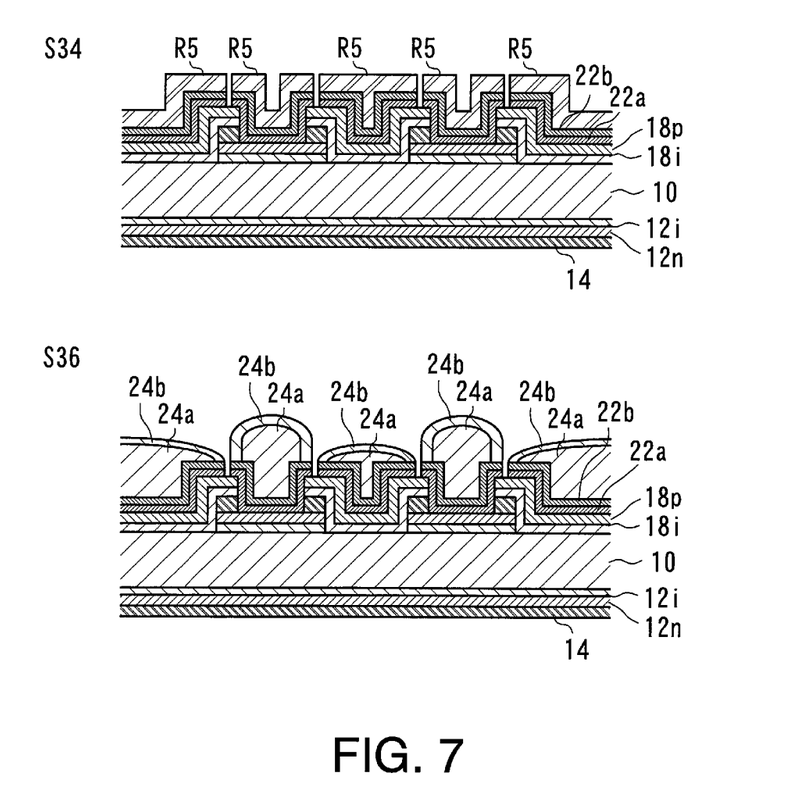
FIG. 7 is sectional views showing production steps of the photoelectric conversion device according to the embodiment of the present invention.

In step S32, the electrode layer 22 is formed on the n-type non-crystalline layer 16n and p-type non-crystalline layer 18p. The electrode layer 22 is configured to include a layer that functions as a seed layer for forming the electrode section 24. Preferably, the electrode layer 22 should have a layered structure of a transparent conductive film 22a and a conductive layer 22b containing a metal. As the transparent conductive film 22a, ITO, $SnO_2$, $TiO_2$, ZnO or the like can be used. As the conductive layer 22b, a metal such as copper (Cu), or an alloy can be used. The transparent conductive film 22a and conductive layer 22b can be formed by a thin film forming method such as a plasma-enhanced chemical vapor deposition method (PECVD) and a sputtering method.

In step S34, the electrode layer 22 is divided. In the region where the electrode layer 22 is formed, a portion of a region formed on the insulating layer 20 is eliminated, so that the electrode layer 22 is divided into an electrode layer 22 electrically connected to the n-type non-crystalline layer 16n and an electrode layer 22 electrically connected to the p-type non-crystalline layer 18p. The dividing of the electrode layer 22 can be performed by a patterning technique using a resist R5. In the patterning, it is possible to apply etching using ferric chloride ($FeCl_3$) and hydrochloric acid (HCl). After the dividing of the electrode layer 22, the resist R3 is eliminated.

In step S36, the electrode section 24 is formed on the region where the electrode layer 22 is left. The electrode section 24 can be formed by means of formation of a metal layer by an electroplating process. For example, it is possible to form the electrode section 24 by sequentially laminating the electrode section 24a composed of copper (Cu) and the electrode section 24b composed of tin (Sn). The electrode section 24 is not limited to this, and may be composed of other metals such as gold and silver, other conductive materials, or a combination of them. The electrode section 24 is formed only on the region where the electrode layer 22 is left, by means of using an electroplating process with application of an electrical potential to the electrode layer 22.

As shown in FIG. 1, the electrode section 24n electrically connected to the n-type non-crystalline layer and the electrode section 24p electrically connected to the p-type non-crystalline layer are formed by the dividing treatment in step S34. The electrode section 24n and electrode section 24p are finger electrodes. Furthermore, the electrode section 26n electrically connected to a plurality of the electrode sections 24n and the electrode section 26p electrically connected to a plurality of the electrode sections 24p are provided. The electrode section 26n and the electrode section 26p are bus bar electrodes.

In this way, it is possible to form the photoelectric conversion device 100 according to the embodiment. Here, the protective layer 30 is provided so as to be a layer whose etching rate is higher than the etching rate of the insulating layer 20 with respect to an etchant containing hydrogen fluoride, and as a result, it is possible to eliminate the protective layer 30 simultaneously with etching the insulating layer 20, and the i-type non-crystalline layer 16i and the n-type non-crystalline layer 16n. It is then possible to form the transparent protective layer 14 instead of the eliminated protective layer 30.

As a result, it is possible to protect the i-type non-crystalline layer 12i and the n-type non-crystalline layer 12n until the protective layer 30 is eliminated. Even though the protective layer 30 is damaged during elimination of the protective film 30, since the transparent protective layer 14 is formed instead, it is possible to maintain a high antireflective-film property. Furthermore, since the protective layer 30 is eliminated simultaneously with etching the insulating layer 20 and the i-type non-crystalline layer 16i and the n-type non-crystalline layer 16n, it is possible to suppress production costs of the photoelectric conversion device 100 and increase the conversion efficiency in the photoelectric conversion device 100.

In the above description, it is allowable to appropriately exchange the polarities of the dopants of the semiconductor substrate 10, n-type non-crystalline layer 12n, n-type non-crystalline layer 16n and p-type non-crystalline layer 18p. For example, it is allowable to change the n-type non-crystalline layer 16n and the p-type non-crystalline layer 18p to p-type and n-type, respectively, and to change the polarity of the semiconductor substrate 10 and the n-type non-crystalline layer 12n to p-type.

The invention claimed is:

1. A method for producing a photoelectric conversion device, comprising:
   a first step comprising forming a first passivation layer on a first surface of a semiconductor substrate, the first passivation layer being composed of a non-crystalline semiconductor film;
   a second step comprising forming a second passivation layer on a second surface of the semiconductor substrate, the second passivation layer being composed of a non-crystalline semiconductor film, the second surface being opposite to the first surface;
   a third step comprising forming a protective layer on the first passivation layer;

a fourth step comprising forming an insulating layer on the second passivation layer; and a fifth step comprising performing patterning so as to eliminate a portion of the second passivation layer and a portion of the insulating layer, in such a state that the first passivation layer is covered with the protective layer;

a sixth step comprising cleaning the surface of the semiconductor substrate and simultaneously eliminating the protective layer after the fifth step, the surface of the semiconductor being exposed by eliminating the second passivation layer and the insulating layer in the firth step; and a seventh step comprising forming an antireflective layer on the first passivation layer in the same manner as in the third step, after the sixth step.

2. The method for producing the photoelectric conversion device according to claim 1, wherein a cleaning liquid used in the sixth step has an etching rate to the protective layer which is higher than an etching rate to the insulating layer.

3. The method for producing the photoelectric conversion device according to claim 1, wherein the protective layer is composed of any one of silicon nitride, silicon oxide and silicon oxynitride.

4. The method for producing the photoelectric conversion device according to claim 1, wherein the protective layer and the insulating layer are composed of a silicon nitride film, and the protective layer comprises a layer whose etching rate is higher than an etching rate of the insulating layer to an etchant containing hydrogen fluoride.

5. The method for producing the photoelectric conversion device according to claim 1, wherein the protective layer and the insulating layer are composed of a silicon nitride film, and the protective layer comprises a layer whose hydrogen content ratio is higher than a hydrogen content ratio of the insulating layer.

6. The method for producing the photoelectric conversion device according to claim 1, wherein the protective layer and the insulating layer are composed of a silicon nitride film, and the protective layer comprises a layer whose silicon content ratio is lower than a silicon content ratio of the insulating layer.

7. The method for producing the photoelectric conversion device according to claim 1, wherein the protective layer and the insulating layer are composed of a silicon nitride film, and the protective layer comprises a layer whose density is lower than a density of the insulating layer.

8. The method for producing the photoelectric conversion device according to claim 1, wherein a film-forming temperature for the insulating layer in the fourth step is higher than a film-forming temperature for the protective layer in third the step.

9. The method for producing the photoelectric conversion device according to claim 1, wherein in the third step, the protective layer is formed by a plasma-enhanced chemical vapor deposition method, and in the fourth step, the insulating layer is formed by a sputtering method.

10. The method for producing the photoelectric conversion device according to claim 1, wherein in the third step, the protective layer is formed by a plasma-enhanced chemical vapor deposition method, and in the fourth step, the insulating layer is formed by a plasma-enhanced chemical vapor deposition method at a higher plasma density than in the third step.

\* \* \* \* \*